United States Patent [19]

Topper

[11] Patent Number: 5,231,398
[45] Date of Patent: Jul. 27, 1993

[54] METHOD AND APPARATUS FOR SELF-TRACKING MULTIPLE ANALOG TO DIGITAL CONVERSION

[75] Inventor: Robert J. Topper, Hatboro, Pa.

[73] Assignee: Panasonic Technologies, Inc., Secaucus, N.J.

[21] Appl. No.: 861,483

[22] Filed: Apr. 24, 1992

[51] Int. Cl.$^5$ .............................................. H03M 1/18
[52] U.S. Cl. .................................... 341/156; 341/155; 341/139
[58] Field of Search ............... 341/156, 138, 139, 140, 341/145, 159, 131

[56] References Cited

U.S. PATENT DOCUMENTS

| | | | |
|---|---|---|---|
| 4,069,479 | 1/1978 | Carpenter et al. | 341/139 |
| 4,733,217 | 3/1988 | Dingwall | 341/122 |
| 4,862,171 | 8/1989 | Evans | 341/156 |

OTHER PUBLICATIONS

"Analog to Digital Conversion Handbook", Analog Devices, Inc. 1986, pp. 426–427.

Primary Examiner—Marc S. Hoff
Assistant Examiner—B. K. Young
Attorney, Agent, or Firm—Ratner & Prestia

[57] ABSTRACT

A method and apparatus for non-linear quantization of a signal that utilizes two or more lowresolution analog to digital converters (ADCs) to allow selective increased quantization levels at desired portions of a signal. This is accomplished by using a primary ADC which provides digital output signals over a first predetermined range, and at least one secondary ADC which provides digital output signals over a smaller predetermined range for the same input values. Accordingly, any secondary ADCs have a smaller quantization step size than the first, and are utilized when finer resolution is desired. The ADCs are kept in alignment by periodically comparing the digital values produced by the ADCs for a known input analog value.

6 Claims, 9 Drawing Sheets

METHOD AND APPARATUS FOR SELF-TRACKING MULTIPLE ANALOG TO DIGITAL CONVERSION

BACKGROUND OF THE INVENTION

1. Field of the Invention

This invention relates to a method and apparatus for non-linear quantization of a signal using an analog to digital converter (ADC), and more particularly, to a method and apparatus allowing finer quantization in a particular part of the dynamic range of the signal without having to increase the number of bits produced by the ADC and, so its total dynamic range.

2. Description of the Related Art

Sometimes it is desirable to digitize a signal in such a way as to have more quantizing levels in one range of signal values than in another. For example, in digital video processing, the effects of quantization noise are distinguishable more readily at black than at white. While adding more bits to the ADC does decrease the quantization noise at black, it also adds more bits and more quantization resolution to the signal at white, where the benefits may not be so distinguishable or desirable. Adding more bits to the ADC adds additional cost and increases the size of the ADC. For example, using an 8-bit system, there are 256 levels available for quantization. Using a 10-bit converter, finer quantization of signals in a range of values around the black level would be available, as there would be 1,024 levels. High speed ADCs capable of operating at these levels, however, may not be available or may be cost prohibitive.

U.S Pat. No. 3,452,297 to Kelly et al (hereinafter Kelly) teaches a non-linear encoder for converting an analog signal into a corresponding binary pulse code signal. The quantizing characteristic of Kelly is defined by major quantizing levels, each pair of major quantizing levels having seven minor quantizing levels between them. The major levels are generated first using a first set of logically controlled current generators and a plurality of corresponding impedances to obtain the major level which is nearest to but less than the input signal. Upon determining the correct major level, the correct minor level is similarly determined using a second series of logically controlled current generators which employ the impedance corresponding to the correct first generator so that the minor levels are added to the correct major level.

U.S. Pat. No. 3,305,855 to Kaneko describes a converting analog to digital converter which quantizes, for example, voice signals with minor quantization steps for signals of smaller amplitudes as compared with quantization steps for signals of larger amplitudes. The quantization step size used for any analog level is determined from an $N^{th}$ order polynomial where N is the number of bits in the digital output signal. The apparatus of Kaneko results in a non-linear transfer characteristic by using an ADC having an integral pulse-code-modulation encoder.

SUMMARY OF THE INVENTION

According to the present invention, there is disclosed a method and apparatus for non-linear quantization of a signal, comprising a first analog to digital converter, which provides an output signal that has a predetermined number of bits of resolution over a first range of digital values; a second analog to digital converter, which provides an output signal having either the same number or different number of bits of resolution as the first converter over a second range of digital values that is less than the first range, which converts analog signals to digital signals; a reference voltage generator which provides a variable reference voltage to the first and the second analog to digital converter and circuitry which combines the output signals of the first and the second analog to digital converters and which selectively routes one of the output signals to the digital output bus.

These together with other objects and advantages which will be subsequently apparent, reside in the details of construction and operation as more fully hereinafter described and claimed, reference being had to the accompanying drawings forming the part hereof.

DESCRIPTION OF THE EXEMPLARY EMBODIMENTS

The present invention combines at least two low resolution ADCs and uses at least one of the converters to give increased quantization levels for a desired subrange of a signal, for example, at the signal levels representing darker portions of a signal representing a video image. Each ADC is provided with a reference voltage. The reference voltage provided to a primary ADC represents the top quantization level of the system. For example, in an 8-bit system, the reference voltage applied to the primary ADC would represent the analog value that would produce the digital value 255. A secondary ADC has a reference voltage applied to it that represents a top quantization level which corresponds, for example, to the analog signal which would produce a digital value of 63 if it were quantized by the primary ADC. Therefore, the primary converter would have 8 bits of resolution from 0 to 255, while the secondary converter would have 8 bits of resolution for analog values which would be digitized in the range of 0 to 63 by the primary ADC, thereby giving an increased quantization resolution for analog signals in this range, as discussed below.

Figure 1:
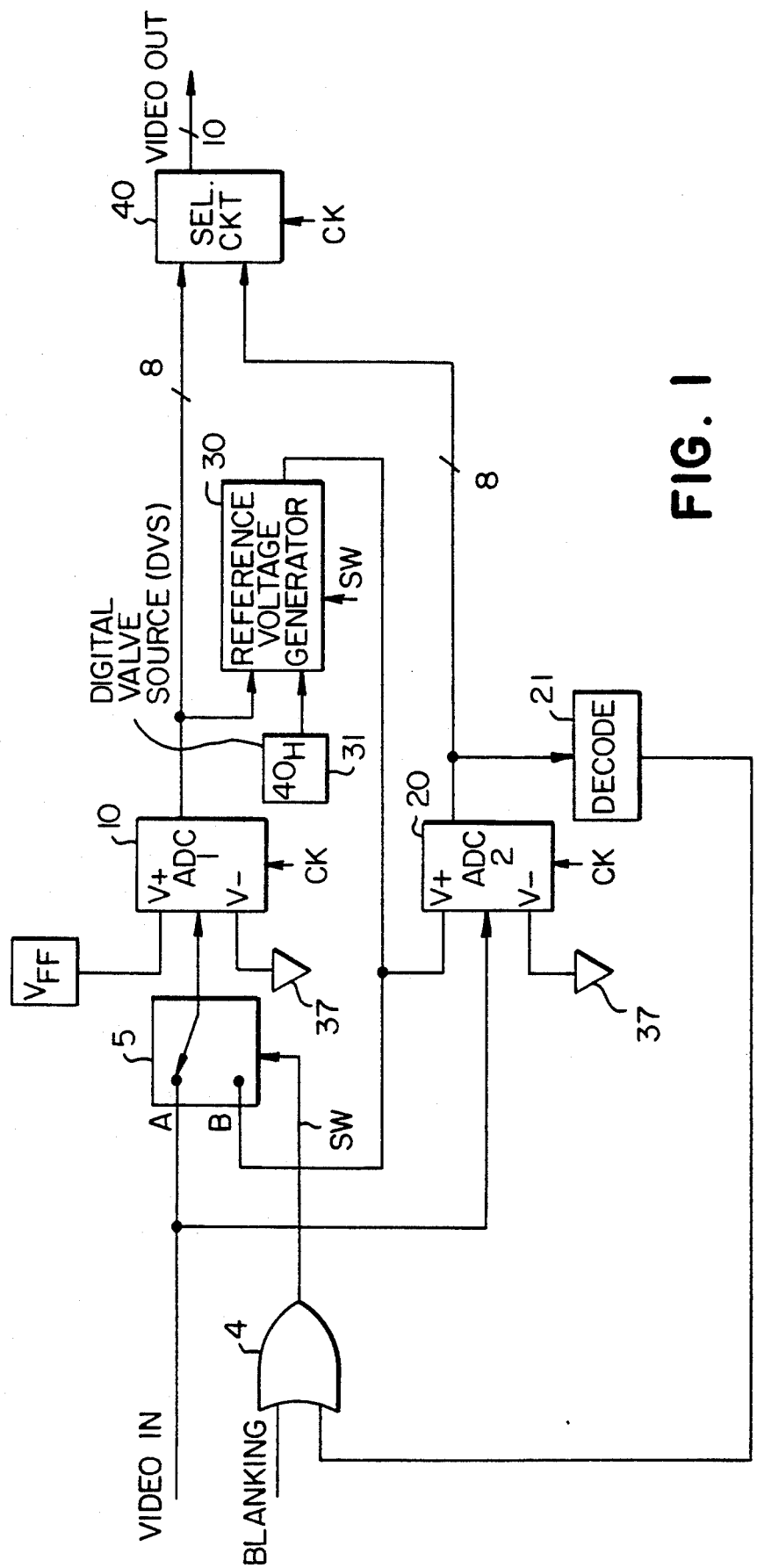
FIG. 1 is a block diagram of a non-linear quantization circuit according to a first embodiment of the present invention.

FIG. 1 is a block diagram of a circuit according to the present invention. In FIG. 1, primary ADC 10 operates as a conventional converter with its output signal representing the entire dynamic range of the incoming signal. Its reference voltages are VO, e.g. ground potential 37, and $V_{FF}$, which correspond to the minimum and maximum analog voltages that may be applied to the ADC 10. These voltages produce digital output values of 0 and 255 ($FF_H$) respectively.

ADC 20 is a secondary converter. ADC 20 produces a maximum digital value (for example, 255) at an analog voltage less than that which produces the same output value from ADC 10. The ADC 20 also produces an overflow/underflow signal (not shown as a separate signal) which is in a logic-low state for analog signal levels within its range and in a logical-high state for analog signal levels outside of its range. For example, if it is desired to increase the quantization levels by a factor of 4 in the range of analog input values for which the ADC 10 produces digital values ranging from 0 to 63 ($3F_H$), the maximum reference of ADC 20, $V_{REF}$, is the analog voltage required to produce a digital value of 63 from ADC 10. Thus, the ADC 20 defines 256 levels for a range of analog values corresponding to the first 64 levels defined by ADC 10. This is equivalent to an increase by a factor of 4 in the quantization resolution of the digital signal in the bottom quarter of the range of values that may be occupied by the signal.

A traditional difficulty that arises in selecting from among values produced by multiple ADCs is being able to make them track each other. The circuit of FIG. 1 solves this problem by utilizing the digital feedback formed by ADC 10, reference voltage generator 30, and switch 5 to continually calibrate the reference voltage generator 30. When switch 5 is in position A, the analog input signal is passed directly to ADC 10. When switch 5 is in position B, however, the ADC 10 samples the reference voltage provided by the reference voltage generator 30. During blanking intervals or when the digital value provided by the ADC 20 is less than or equal to its maximum value and no overflow is indicated, the switch 5 is moved to position B responsive to the output signal, SW, of OR gate 4. In this position, the maximum reference of ADC 20 is digitized by analog to digital converter 10 and applied to the reference voltage generator 30 which, as described below, is enabled by the signal SW to adjust the level of the reference voltage, $V_{REF}$.

A decoder 21, coupled to the output port of the ADC 20 produces a logic-high output signal when the value provided by the ADC 20 is less than or equal to 255 and there is no overflow. When this signal is logic-high, the output signal of the system shown in FIG. 1 is provided by the ADC 20; the ADC 10 is not being used. The signal provided by the decoder 21 is applied to the OR gate 4, which also receives a signal that is in a logic-high state during video blanking intervals.

Whenever the output signal of the OR gate 4 is logic-high, the output signal of analog to digital converter 10 is compared with the digital word corresponding to the upper limit of ADC 20, for example, 64 ($40_H$), provided by a source 31. If the reference voltage is too low, the reference voltage VREF generator 30 increases the level of its output voltage. If the reference voltage is too high, the reference voltage generator 30 reduces its output voltage. In this manner, ADC 20 always has the correct reference voltage, even if $V_{FF}$ is varied.

Figure 2:
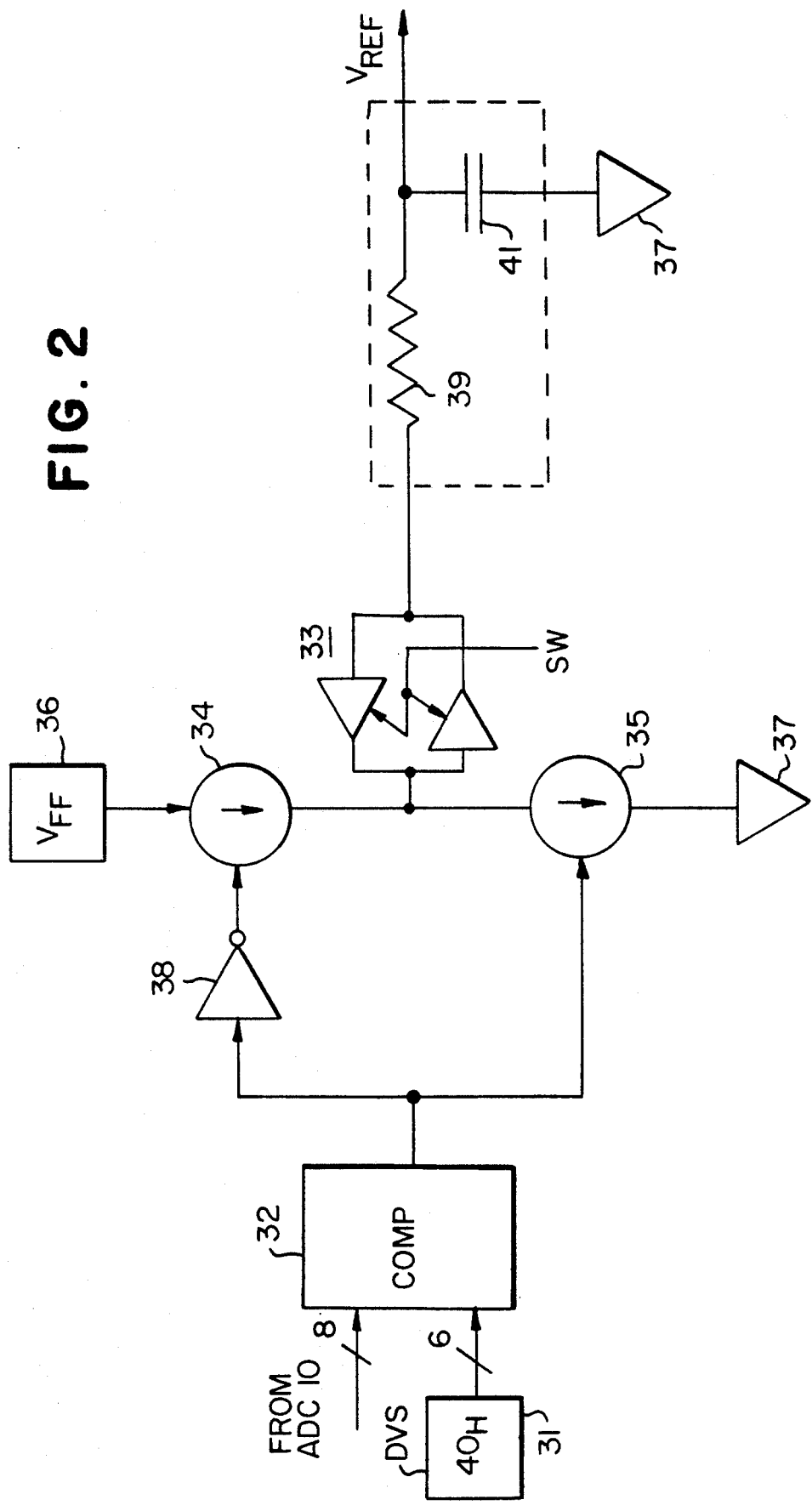
FIG. 2 is a block diagram of a reference voltage generator suitable for use in the circuit shown in FIG. 1.

Reference voltage generator 30 may be implemented in a variety of ways, one of which is shown in FIG. 2. In FIG. 2, the digital value provided by ADC 10 and the digital value from source 31, corresponding to the upper reference value of ADC 20, are compared in a digital comparator 32. Comparator 32 produces an output error signal which is in a first state (e.g. logic-high) if the value provided by ADC 10 is greater than or equal to the reference value and is in a second state (e.g. logic-low) otherwise.

The output signal of the comparator is coupled directly to a controlled current sink 35 and indirectly, through an inverter 38, to a controlled current source 34. The output terminal of the current source 35 and the input terminal of the current sink 35 coupled, via an analog gate 33, to an integrating circuit, formed by resistor 39 and capacitor 41. In the exemplary embodiment of the invention, the analog gate 33 is formed by a pair of cross-coupled three-state gates. The gate 33 is enabled by the signal SW generated by the OR gate 4. When this signal is in a logic-high state and the output signal of the comparator 32 is in the first state, current source 34 is enabled and provides a current through resistor 39 to charge the capacitor 41, increasing the potential across the capacitor. The potential across the capacitor 41 defines the reference voltage $V_{REF}$. When the gate 33 is enabled and the output signal of the comparator is in the second state, current source 34 is disabled and current sink 35 is enabled. In this configuration, charge is drained from the capacitor 41 through the resistor 39 and the potential across the capacitor 41 is reduced.

Thus, if the digital value provided by ADC 10 is greater than or equal to the reference value provided by source 31, the output reference voltage is decreased. Similarly, if the digital value provided by ADC 10 is less than the reference value, the reference voltage is increased.

Figure 3:
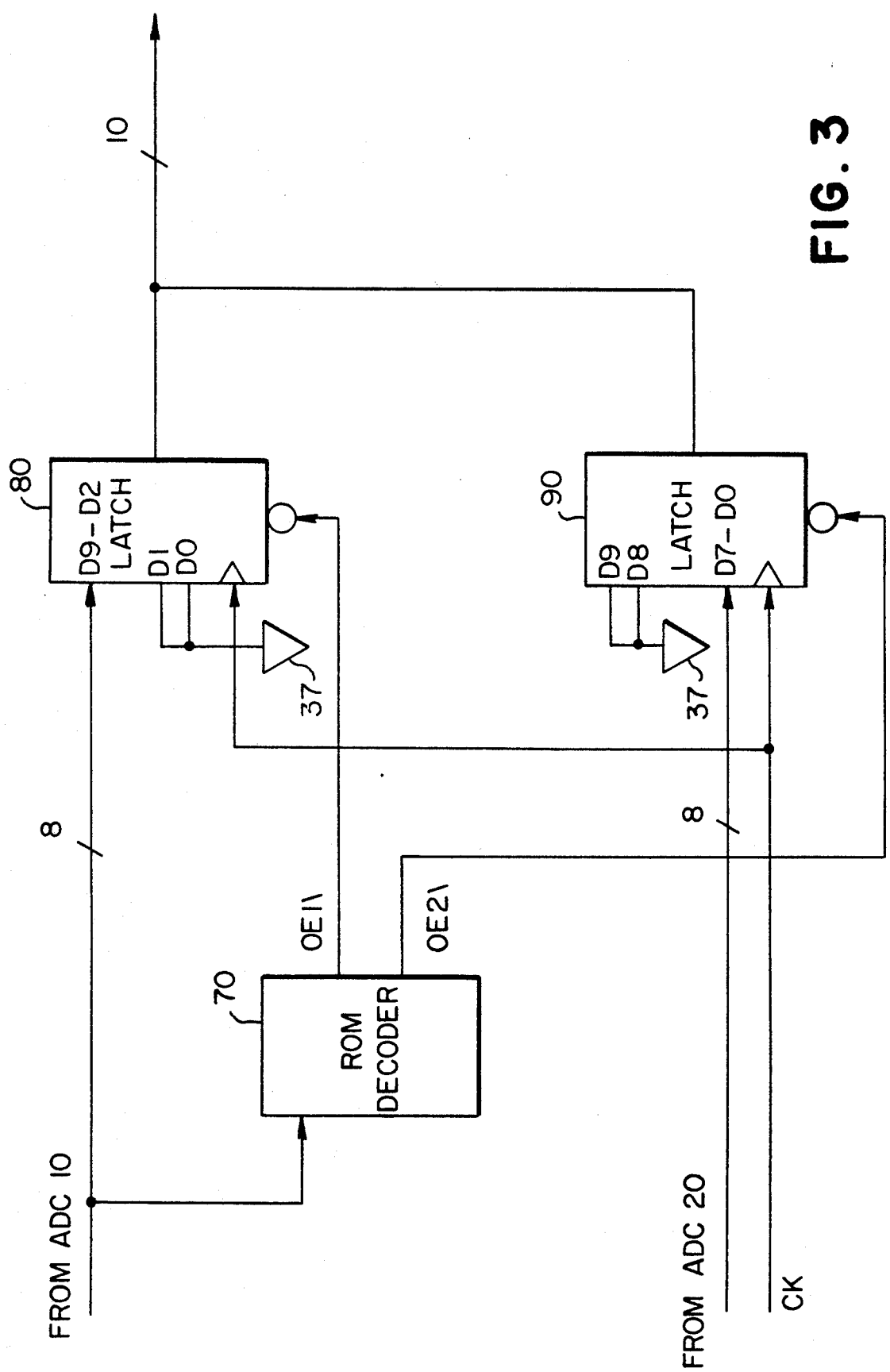
FIG. 3 is a block diagram of a selecting circuit suitable for use in the circuit shown in FIG. 1.

As shown in FIG. 1, two 8-bit streams, one from each of the two ADCs 10 and 20, are applied to selecting circuit 40. Selecting circuit 40 comprises, for example, a ROM decoder 70 having two output signals coupled to respective ten-bit latches 80 and 90, as shown in FIG. 3. Based on the values received from the ADC 10, the ROM decoder 70 selects one of the ADCs 10 and 20 to provide output values to the digital output bus by selecting a respective one of the latches 80 and 90. The eight-bit value provided by ADC 10 is coupled to the eight most significant bit (MSB) positions of the latch 80 while the last two least significant bit (LSB) positions are tied to ground. The eight-bit value provided by ADC 20 is coupled to the eight LSB positions of latch 90 while the two MSB positions are tied to ground. The exemplary latches 80 and 90 are coupled to the output bus with a three-state interface. When a latch is not selected, all of its output terminals present a high impedance to the output bus.

In this example, when the signal from ADC 10 is in the range from 0-63, indicating that the analog input signal is within the lower 25% of the total range, the ROM 70 selects the output signal of ADC 20 to apply to the digital output bus. This selection ensures that the smaller quantization steps provided by ADC 20 are used for analog values that are digitized in this range. Similarly, when the output signal from ADC 10 is in the range from 64-255, the ROM 70 couples the values provided by ADC 10 to the bus. This produces larger quantization steps for analog values in this range. The 8-bit stream provided by ADC 20 is shifted by two to less significant bit positions with respect to the values provided by the ADC 10 (divided by 4) to produce the 10-bit output values combiner circuit 40. Thus, the latch 80 effectively scales the signal provided ADC 10 by a factor of four relative to the signal provided by ADC 20 via latch 90. The two low-order bits of the value provided by the latch 80 are always logic-low. In the ADC 20, it is these two bits which implement the finer quantization steps.

Figure 4:
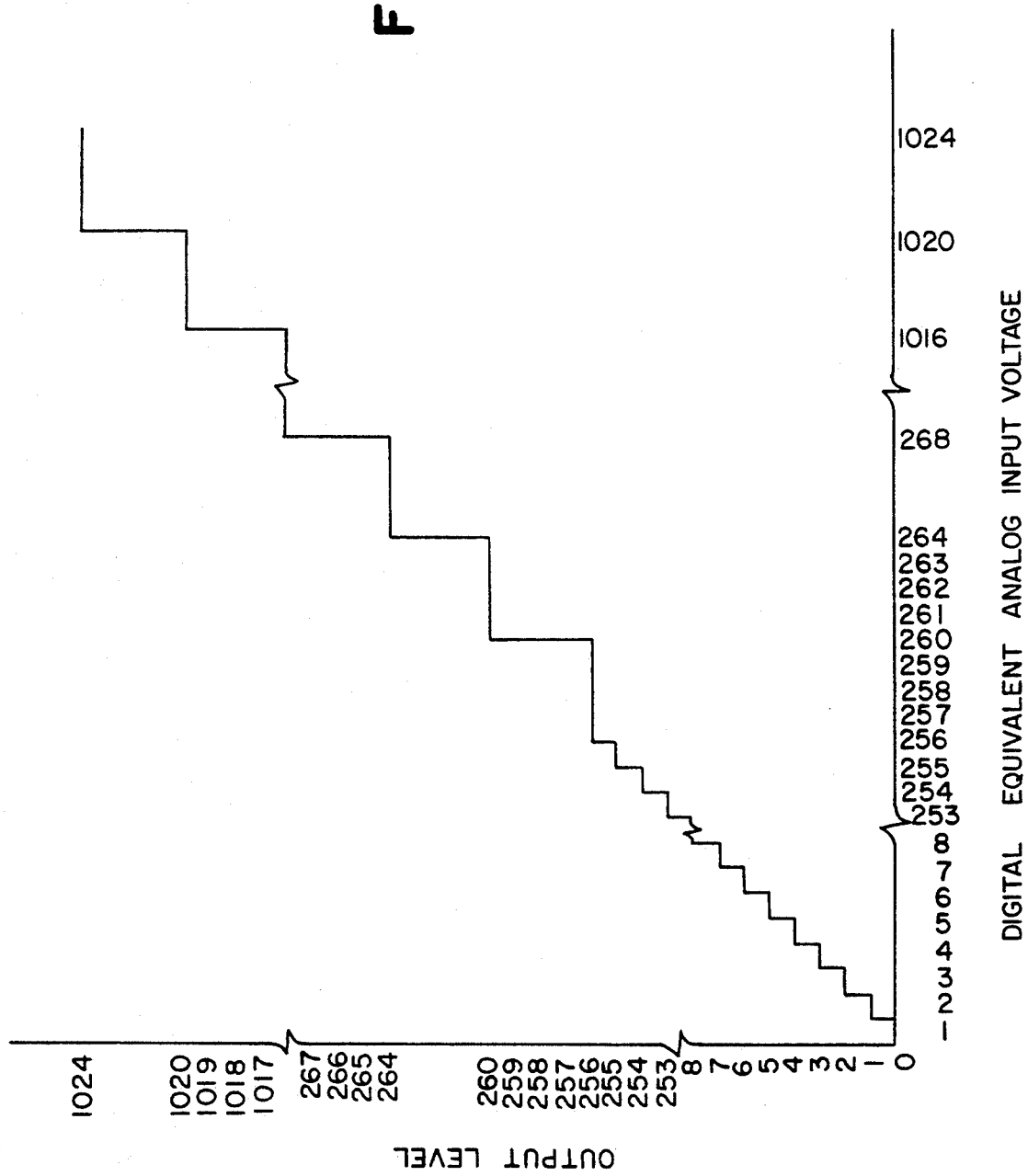
FIG. 4 is a graph which illustrates the quantization that may be achieved using the circuit of FIGS. 1-3.

FIG. 4 is a graph which illustrates how analog values are quantized by the circuit of FIGS. 1-3. As can be seen from FIG. 4, due to ADC 20, resolution is increased in the lower level near values which represent black where increased resolution is desired. Once the input signal increases above the maximum reference of ADC 20, the resolution decreases as the circuit operates using ADC 10.

Figure 5:
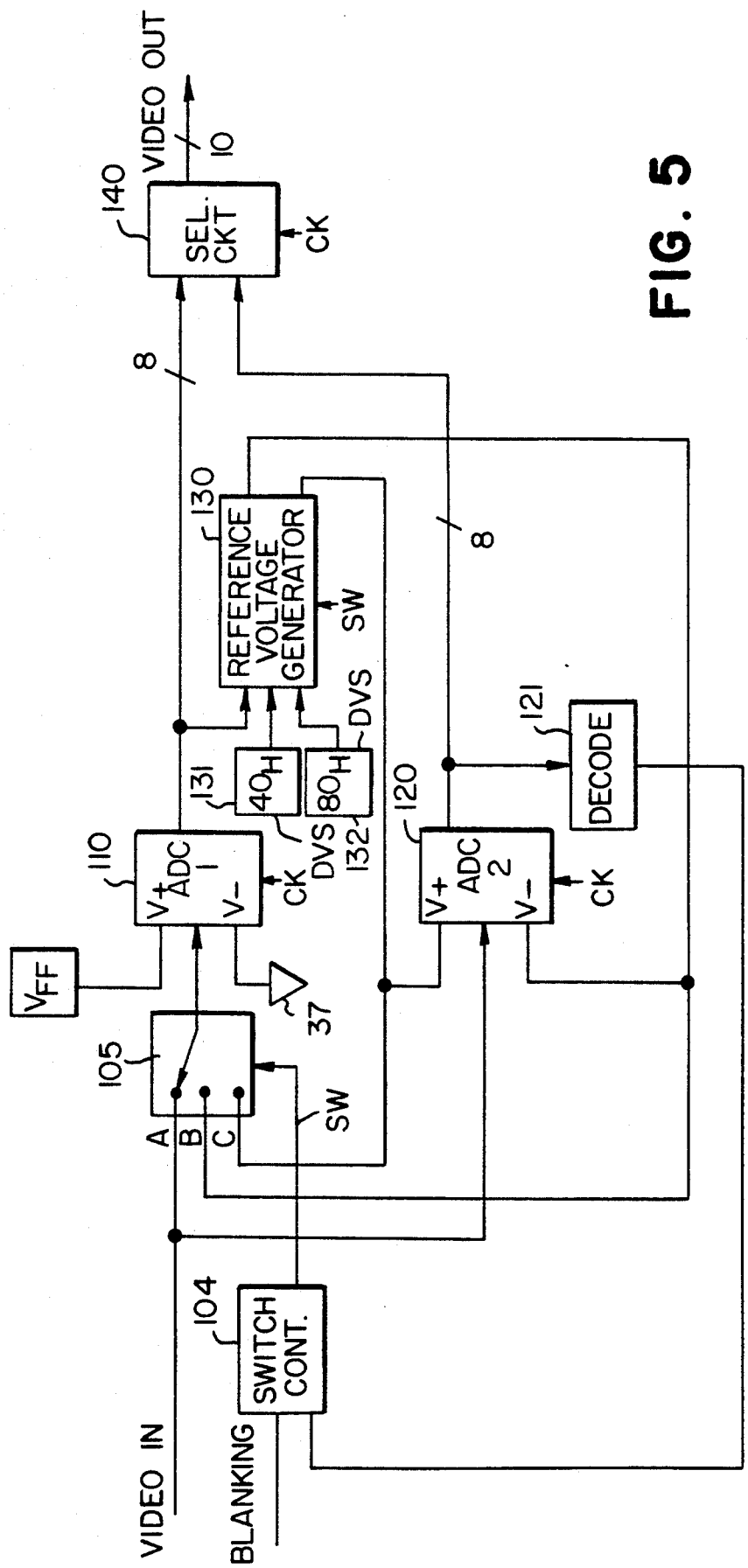
FIG. 5 is a block diagram of an alternative embodiment non-linear quantization circuit according to the present invention.

FIG. 5 illustrates an alternative embodiment which is utilized in situations where higher quantization resolution is desired is in the middle of the signal range. In FIG. 5, a three position switch 105 controls the selection of the analog signal which is applied to primary ADC 110. This signal may be either an analog input signal or one of the two reference voltages used by the secondary ADC 120. Primary ADC 110 may be identical to the primary ADC 10 of FIG. 1. The exemplary reference voltage generator 130 includes two reference voltage generators each of which may be identical to the one shown in FIG. 2.

Figure 6:
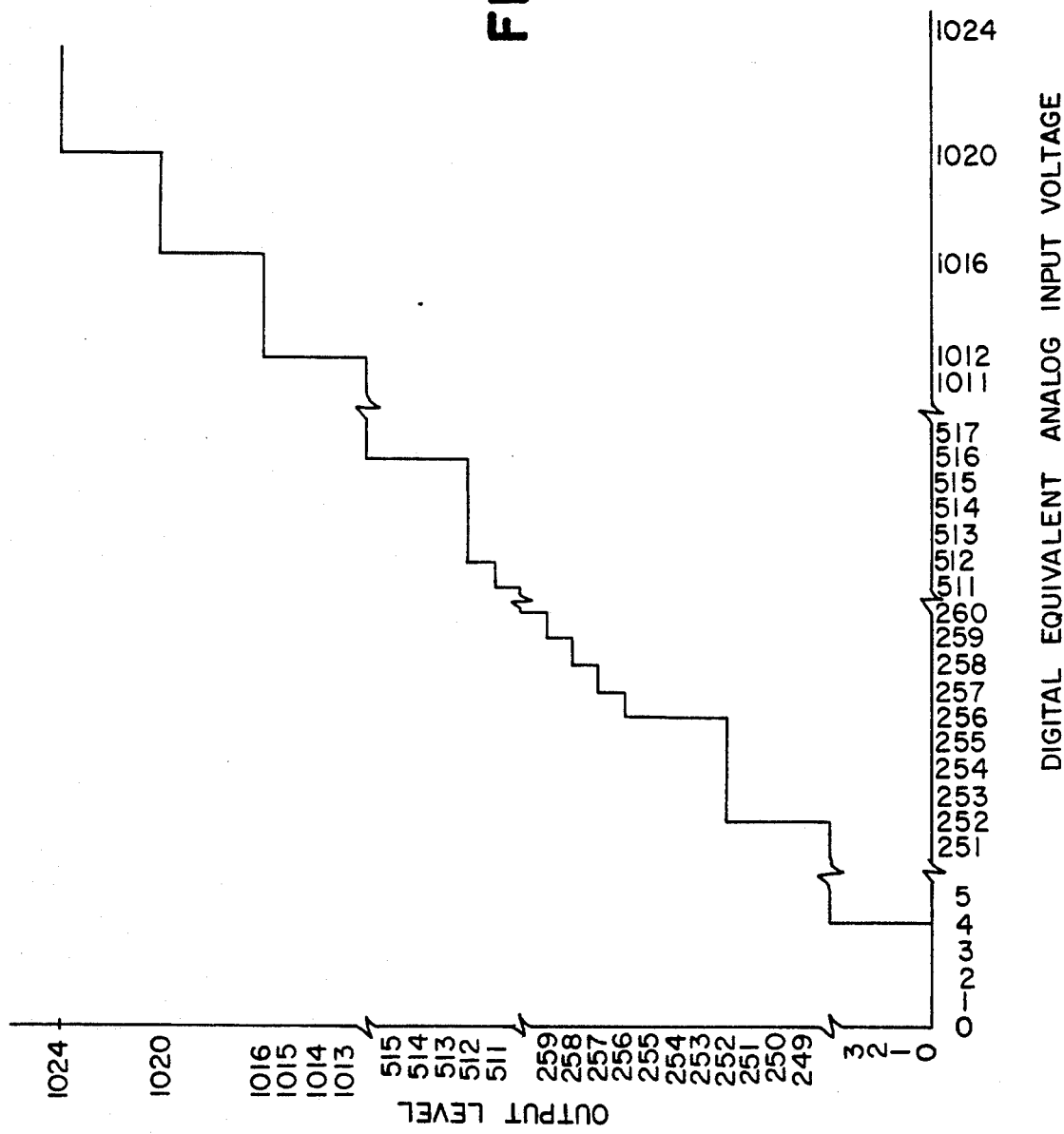
FIG. 6 is a graph which illustrates the quantization that may be achieved using the circuit of FIG. 5.

The major difference between the circuits shown in FIGS. 1 and 5 is that, in the circuit of FIG. 1, the V− terminal of secondary ADC 20 is coupled to a source of low reference potential (e.g. ground) while in the circuit of FIG. 5 the V− terminal of ADC 120 receives the lower of the two reference voltages provided by the reference voltage generator 130. V+ of ADC 120 receives the higher of the two reference voltages. The digital value produced by the ADC 110 is compared to two reference digital values, provided by sources 131 and 132, which represent the two reference voltages. ADC 120 is operational when the incoming voltage is within the range defined by the two reference values, and ADC 110 is operable outside of this range. The quantization produced by this circuitry is shown in FIG. 6. As can be seen from this Figure, the area of highest resolution in this exemplary embodiment of the invention is centrally located in the middle of the signal range.

In this exemplary embodiment of the invention, The reference voltages V+ and V− for the ADC 120 are calibrated during alternate blanking intervals and whenever the ADC 120 provides a digital output, as decoded by the decoder 121, that is between its maximum or minimum values. The decoder provides a logic-high output signal to a switch controller 104 which also receives a signal, BLANKING, that is in a logic-high state during the vertical and horizontal blanking intervals.

During the active video interval, the controller 104 moves the switch 105 from position A to position B or C whenever the output signal of the ADC 120 is operating within its range. In the exemplary embodiment of the invention, when the output signal of the ADC 120 is within its range and the overflow/underflow signal is logic-low, the controller 104 conditions the switch 105 to move to position B or C providing the respective lower or higher reference voltage to the input terminal of the ADC 110. The output signal, SW, of the switch controller 104 is also applied to the reference voltage generator 130 to allow a capacitor (not shown) which determines the lower or higher reference voltage, respectively, to be either charged or discharged as set forth above with reference to FIG. 2. It is contemplated that, when the switch 105 is not in position A it may alternate between positions B and C at a fixed rate or during alternate intervals when the ADC 110 is not being used to digitize input signals.

During the blanking intervals, switch controller 104 may, for example, alternately move switch 105 into the B and C positions to enable the corresponding portions of the reference signal generator during alternate blanking intervals. Alternatively, controller 104 may move the switch 105 into each of the positions B and C and enable the reference signal generator to modify the respective reference voltages during a respective portion of each blanking interval.

The digital output signals of the ADCs 110 and 120 are applied as the signal VIDEO OUT by the selecting circuit 140. This circuit is similar to the one shown in FIG. 3 except that the ROM decoder 70 is programmed to enable latch 80 for digital values between 0 and 63 ($3F_H$) and between 128 ($80_H$) and 255 ($FF_H$) but to enable the latch 90 for digital values between 64 ($40_H$) and 127 ($7F_H$). The circuit shown in FIG. 3 is also modified by applying a logic-high value to the input terminal D8 of latch 90 while applying a logic-low value to the input terminal D9.

Figure 7:
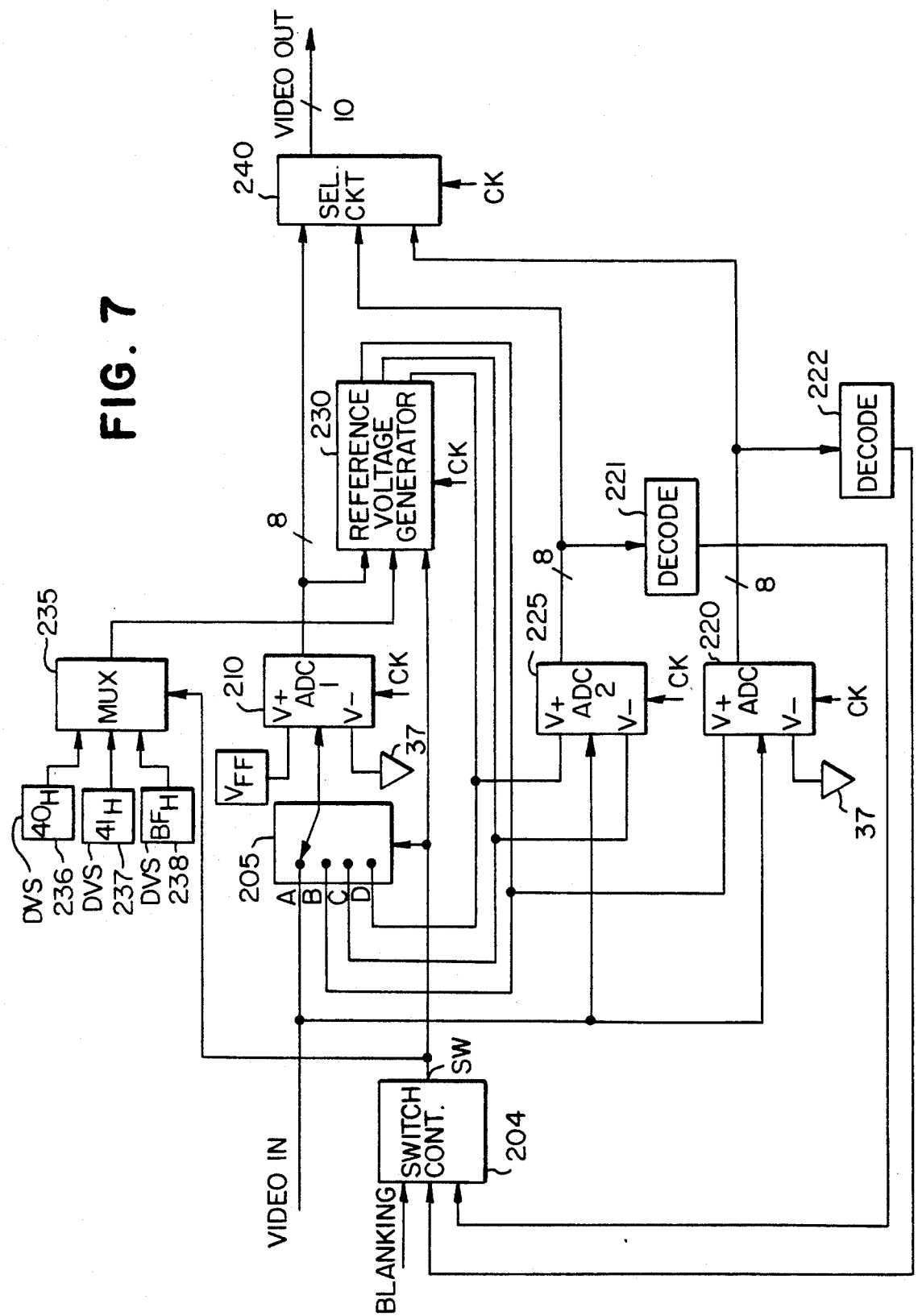
FIG. 7 is a block diagram of a non-linear quantization circuit according to a third embodiment of the present invention.

The circuit of FIG. 7 allows a gradual increase in quantization resolution. By, selecting from among a plurality of converters, selective areas of increased resolution can be provided, for example, high resolution (e.g. 10-bits) for signal levels near black, mid-level resolution (e.g. 9-bits) for levels between black and white, and low resolution (e.g. 8-bits) for signal levels near or at white. Low-resolution ADC 210 and high resolution ADC 220 operate in essentially the same manner as primary ADC 10 and secondary ADC 20 in FIG. 1. However, the circuit of FIG. 7 includes mid-level resolution ADC 225, which, in this example, is used to convert analog signal levels which would be digitized in a range from 64 to 191 ($40_H$-$BF_H$), by the ADC 225, to achieve 9-bits of quantization resolution for these signal levels. Switch 205 determines which of the three input signals is applied to low resolution ADC 210 (analog input signal or reference voltages for sampling).

Reference generator 230 generates three reference voltages. Multiplexer 235, responsive to the signal SW provided by the switch controller 204, selects the appropriate reference digital value to be applied to the reference signal generator 230. In this embodiment of the invention, the reference signal generator includes a single comparator which is coupled in parallel to three integrator circuits. Each integrator circuit is individually enabled by a respective analog gate which is selected by the signal SW.

Figure 8:
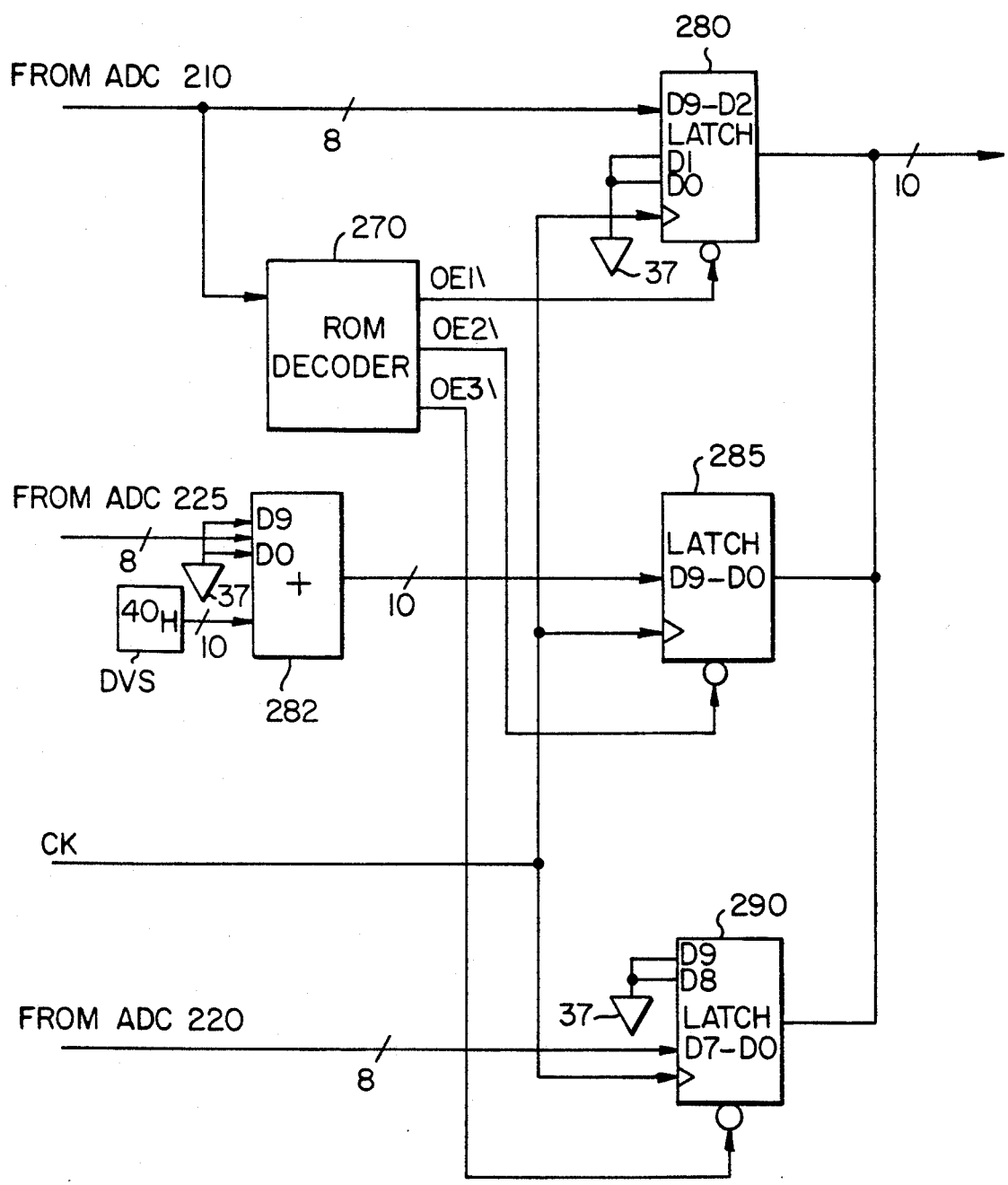
FIG. 8 is a block diagram of a combiner circuit suitable for use in the circuit of FIG. 7.

The output signals of the ADCs are combined using the combiner circuit 240, shown in detail in FIG. 8. The signal from ADC 210 is applied to latch 280 and ROM decoder 270. Latches 280, 295, and 290 comprise means for switching the output signals of the various ADCs onto the digital output bus. ROM decoder 270 selectively activates one of the three latches 280, 295 or 290 based upon the truth table shown in Table 1.

TABLE 1

| OUTPUT SIGNAL OF ADC 201 | OE1 | OE2 | OE3 |
|---|---|---|---|
| 0–63 | 1 | 1 | 0 |
| 64–191 | 1 | 0 | 1 |

TABLE 1-continued

| OUTPUT SIGNAL OF ADC 201 | OE1 | OE2 | OE3 |
|---|---|---|---|
| 192-255 | 0 | 1 | 1 |

Figure 9:
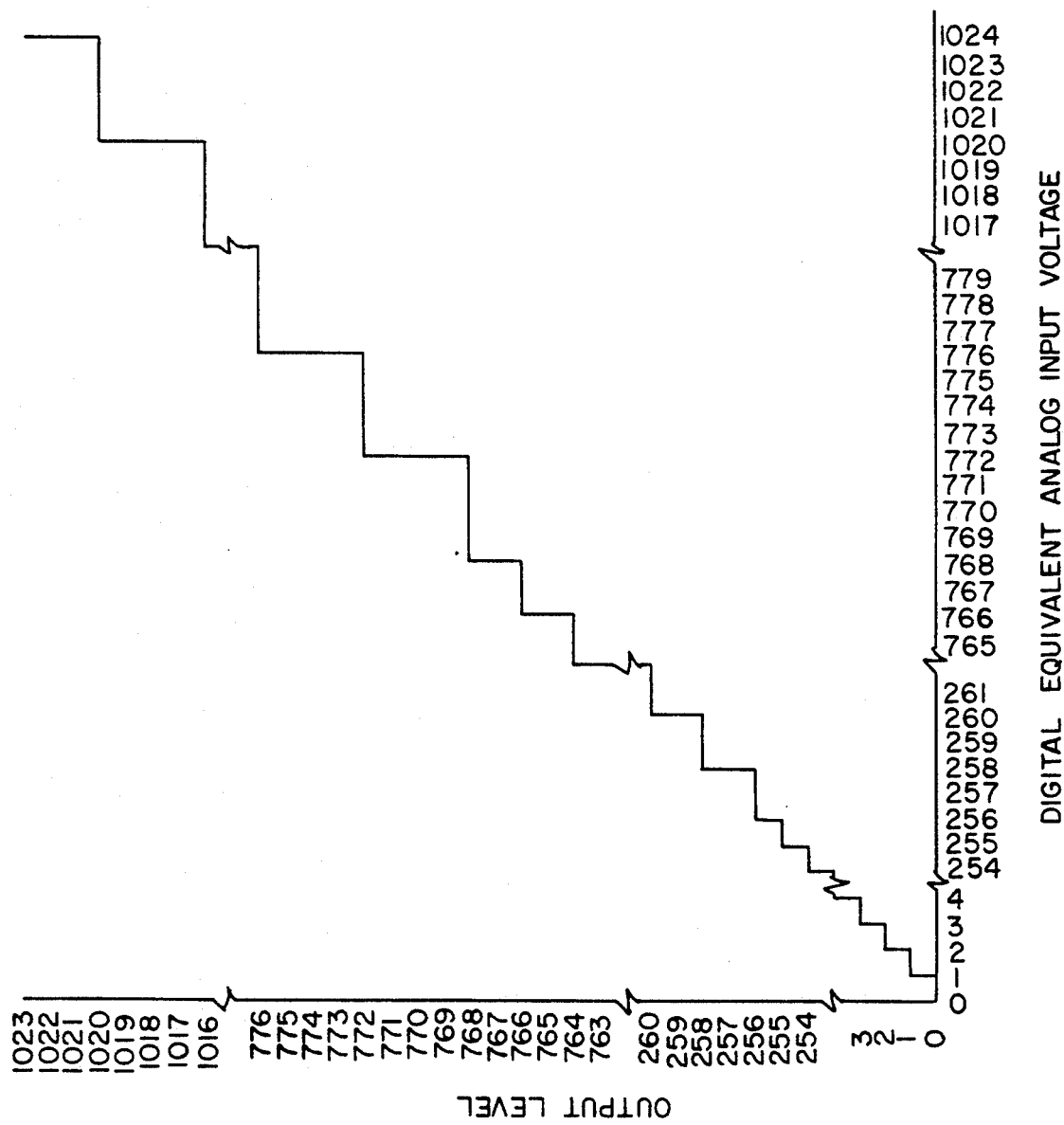
FIG. 9. is a graph which illustrates the quantization that may be achieved using the circuit of FIGS. 7 and 8.

Thus, when the signal from ADC 210 is between 0-63, this indicates that the analog input signal is in the lower 25% of its total range, which, in this example, is the range where the finest quantization is desired. In accordance with the truth table of FIG. 9, the output signal from ADC 220 is chosen, providing the finest quantization steps. Similarly, if the output signal from ADC 210 is between 64 and 191, the analog input signal is in the middle 50% of the total range and, in accordance with the truth table in FIG. 9, the output signal from mid-level resolution ADC 225 is selected and applied to the digital output bus, yielding a mid-range signal having a coarser quantization. For signals from ADC 210 exceeding 191, the output signal from low-resolution ADC 210 is applied directly to the bus.

The output signal of ADC 210 is shifted to more significant bit positions by 2 bits (multiplied by 4), through the latch 280 of FIG. 8. The output signal of ADC 225 is shifted to more significant bit positions by 1 bit (multiplied by 2) via the connections to adder 282 which adds a fixed offset value of 256 ($100_H$) to each sample produced by the ADC. The output signal of ADC 220 is used without shifting, the two most significant bits of the 10 bit value provided by latch 20, however, are set to zero (logic-low). The output quantization for the circuit of FIGS. 7 and 8 is shown in FIG. 10. As can be seen, the resolution decreases as the signal value increases from levels which represent black to those which represent white.

The many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, and accordingly, all suitable modifications and equivalents may be resorted to, falling within the scope of the invention.

The invention claimed is:

1. A device for non-linear quantization of analog electrical signal, comprising:
   first analog to digital conversion means for generating first digital signals having plural bit positions which represent said analog electrical signals over a predetermined range of analog signal levels;
   second analog to digital conversion means for generating second digital signals which represents said analog electrical signals, said second analog to digital conversion means having an input terminal for applying a reference signal which defines a range of analog values represented by the second digital signals the range of said second digital signals corresponding to more than one bit position of said first digital signals;
   calibrating means, coupled to said first analog to digital conversion means for continually adjusting said reference signal to be at a level which represents a predetermined sub-range of the predetermined range of analog signal levels; and
   selecting means, coupled to said first and second analog to digital conversion means, for providing the second digital signals, exclusive of the first digital signals, when the first digital signals represent analog signal levels in the predetermined sub-range and to provide the first digital signals, exclusive of the second digital signals, otherwise.

2. A device as recited in claim 1, wherein said selecting means comprises:
   digital signal scaling means, for scaling one of said first and second digital signals to represent a range of analog values consistent with the range of analog values represented by another one of said first and second digital signals;
   an output port;
   switching means, responsive to a control signal, for selectively coupling one of the first and second digital signals to said output port; and
   decoding means for generating said control signal responsive to the first digital signal.

3. A device as recited in claim 1, further comprising:
   third analog to digital conversion means for generating third digital signals which represent said analog electrical signals, and third analog to digital conversion means having an input terminal for applying a further reference signal which defines a range of analog values represented by the third digital signals;
   wherein said calibrating means further includes means for continually adjusting said further reference signal to be at a level which represents a further predetermined sub-range of the predetermined range of analog signal levels, different from said predetermined sub-range; and
   wherein said selecting means provides the third digital signals when the first digital signals represent analog signal levels in the further predetermined sub-range.

4. A device as recited in claim 3, wherein said selecting means comprises:
   digital signal scaling means, for scaling two of said first, second and third digital signals to represent a range of analog values consistent with the range of analog values represented by the other one of said first, second and third digital signals;
   an output port;
   switching means, responsive to a control signal, for selectively coupling one of the first, second and third digital signals to said output port; and
   decoding means for generating said control signal responsive to the first digital signal.

5. A device for non-linear quantization of analog electrical signals, comprising:
   first analog to digital conversion means for generating first digital signals which represent said analog electrical signals over a predetermined range of analog signal levels;
   second analog to digital conversion means for generating second digital signals which represent said analog electrical signals, said second analog to digital conversion means having an input terminal for applying a reference signal which defines a range of analog values represented by the second digital signals;
   calibrating means, coupled to said first analog to digital conversion means for controlling said reference signal to be at a level which represents a predetermined sub-range of the predetermined range of analog signal levels, said calibrating means comprising:

reference signal generation means for generating said reference signal and, responsive to an error signal, for changing said reference signal in amplitude to minimize said error signal;

means, coupled to the first analog to digital conversion means, for comparing the first digital signal to a predetermined reference digital value, representing said reference signal, to generate said error signal when the first digital signal is different from the reference digital value;

switch means, responsive to an enabling control signal for applying said reference signal to said first analog to digital conversion means, as an analog input signal; and control means for generating said enabling control signal at instants determined by said analog electrical signal; and selecting means, coupled to said first and second analog to digital conversion means, for providing the second digital signals when the first digital signals represent analog signal levels in the predetermined sub-range and to provide the first digital signals otherwise.

6. A device for non-linear quantization of a signal comprising:

a digital output bus;

a plurality of analog to digital conversion means, each of said analog to digital conversion means providing a respective digital output signal and having a respective predetermined number of bits of resolution over a respective predetermined range of digital output values, for converting analog signals to digital signals, wherein the predetermined range of at least a first one of the plurality of analog to digital conversion means corresponds to analog values representing at least two bits of resolution of a second one of said plurality of analog to digital conversion means;

reference signal generating means for providing a respective reference signal to said first analog to digital conversion means and for continually adjusting the reference signal to ensure that the digital values produced by the first analog to digital conversion means, in response to an analog signal, are consistent with digital values produced by the second analog to digital conversion means; and selecting means for selectively routing the digital output signal of one of said plurality of analog to digital conversion means to said digital output bus, said device selectively providing quantized signals of varying degrees of resolution, said resolution being defined by which of the digital output signals is routed to said digital output bus.

* * * * *

UNITED STATES PATENT AND TRADEMARK OFFICE
CERTIFICATE OF CORRECTION

PATENT NO. : 5,231,398
DATED : July 27, 1993
INVENTOR(S) : Robert J. Topper

It is certified that error appears in the above-indentified patent and that said Letters Patent is hereby corrected as shown below:

Column 7, line 50, "signal" should be -- signals --.

Column 8, line 24, delete "and" and insert--said--.

Signed and Sealed this

Twenty-sixth Day of April, 1994

Attest:

BRUCE LEHMAN

*Attesting Officer*   *Commissioner of Patents and Trademarks*